United States Patent [19]
Saia et al.

[11] Patent Number: 5,652,559
[45] Date of Patent: Jul. 29, 1997

[54] METHOD OF MICROMACHINING ELECTROMAGNETICALLY ACTUATED CURRENT SWITCHES WITH POLYIMIDE REINFORCEMENT SEALS, AND SWITCHES PRODUCED THEREBY

[75] Inventors: Richard Joseph Saia, Schenectady; Mario Ghezzo, Ballston Lake; Bharat Sampath Kumar Bagepalli, Schenectady; Kevin Matthew Durocher, Waterford, all of N.Y.

[73] Assignee: General Electric Company, Schenectady, N.Y.

[21] Appl. No.: 626,311

[22] Filed: Apr. 1, 1996

Related U.S. Application Data

[62] Division of Ser. No. 169,272, Dec. 20, 1993, Pat. No. 5,531,018.

[51] Int. Cl.[6] .................................................. H01H 51/22
[52] U.S. Cl. ........................ 335/78; 156/155; 257/644
[58] Field of Search ........................ 335/78–86; 156/155, 156/248, 633.1, 656.1; 427/271–2, 259; 257/644, 510, 635

[56] References Cited

U.S. PATENT DOCUMENTS

| | | |
|---|---|---|
| 5,262,000 | 11/1993 | Welbourn et al. . |
| 5,374,792 | 12/1994 | Ghezzo et al. . |
| 5,384,483 | 1/1995 | Huang .......................................... 257/644 |
| 5,472,539 | 12/1995 | Saia et al. ................................... 156/155 |

*Primary Examiner*—Lincoln Donovan
*Attorney, Agent, or Firm*—Ann M. Agosti; Marvin Snyder

[57] ABSTRACT

An insulating layer with at least one via is provided over a metal plate. A sacrificial layer is applied over a portion of the insulating layer so that the sacrificial layer extends into the via. A metal bridge having at least one opening is provided over a portion of the sacrificial layer and a portion of the insulating layer so that the metal bridge extends over the via and the opening is situated adjacent a portion of the sacrificial layer. A reinforcing seal layer with a well is provided over the metal bridge so that the well is situated adjacent to at least a portion of the opening. The sacrificial layer is then removed.

6 Claims, 14 Drawing Sheets

METHOD OF MICROMACHINING ELECTROMAGNETICALLY ACTUATED CURRENT SWITCHES WITH POLYIMIDE REINFORCEMENT SEALS, AND SWITCHES PRODUCED THEREBY

This application is a division of application Ser. No. 08/169,272, filed Dec. 20, 1993 now U.S. Pat. No. 5,531,018

BACKGROUND OF THE INVENTION

1. Field of the Invention

This invention relates generally to micromachining methods and, more particularly, to a method of fabricating a micromachined current switch with moving contacts which are sealed and reinforced with a polyimide material.

2. Description of the Related Art

When fabricating micromechanical structures, micromachined moving parts usually undergo a processing step in which they are released for further processing by etching away either a mold or a sacrificial release layer. For example, commonly assigned Ghezzo et al., "Micromechanical Moving Structures Including Multiple Contact Switching System, and Micromachining Methods Therefor," U.S. application Ser. No. 08/000,172, filed Jan. 4, 1993, describes one method for using a copper release layer. The resulting moving parts can be fragile because small metal hinges hold contact bridges in position. Consequently, processing steps which require forceful flows of liquid or air can damage these parts.

Reinforcement of the hinges of micromachined moving parts not only would serve to protect these moving parts during fabrication but would also be beneficial during normal operation of the parts. Any such reinforcement, however, must be flexible enough so as to not interfere with the movement of the part.

When switches are batch-fabricated on a substrate, they need to be separated or cut into individual switches after fabrication. A simple method of cutting a substrate is to use a standard wafer saw. A seal is needed to protect the switches during sawing because wafer particles can interfere with switch movement during operation, and forced liquids which are used to cool the saw can damage the contact bridges.

SUMMARY OF THE INVENTION

Accordingly, one object of the invention is to provide a method of fabricating an electromagnetically-actuated, sealed and reinforced current switch with an integrated magnetic coil.

Briefly, in accordance with a preferred embodiment of the invention, a method of fabricating the moving portion of a switch comprises providing an insulating layer with at least one via over a metal plate. A sacrificial layer is applied over a portion of the insulating layer so that the sacrificial layer extends conformally into the via. A metal bridge having at least one opening is provided over a portion of the sacrificial layer and a portion of the insulating layer so that the metal bridge extends over the via and the opening is situated adjacent to a portion of the sacrificial layer. A reinforcing seal layer with a well is provided over the metal bridge so that the well is situated adjacent to at least a portion of the opening in the metal bridge. The sacrificial layer is then removed.

In accordance with another preferred embodiment of the invention, a micromachined switch comprises an insulating layer situated over a metal plate and having at least one via extending to the metal plate. A metal bridge is situated above the via and has a switch contact extending into a portion of the via. The metal bridge and the insulating layer have an air gap therebetween with the metal bridge having at least one opening adjacent the air gap. An electrically conductive coil surrounds at least a portion of the metal bridge. A reinforcing seal layer is situated over the metal bridge and the coil, and has a well situated adjacent to a portion of the metal bridge including at least a portion of the opening in the metal bridge.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF PREFERRED EMBODIMENTS OF THE INVENTION

Figure 1:
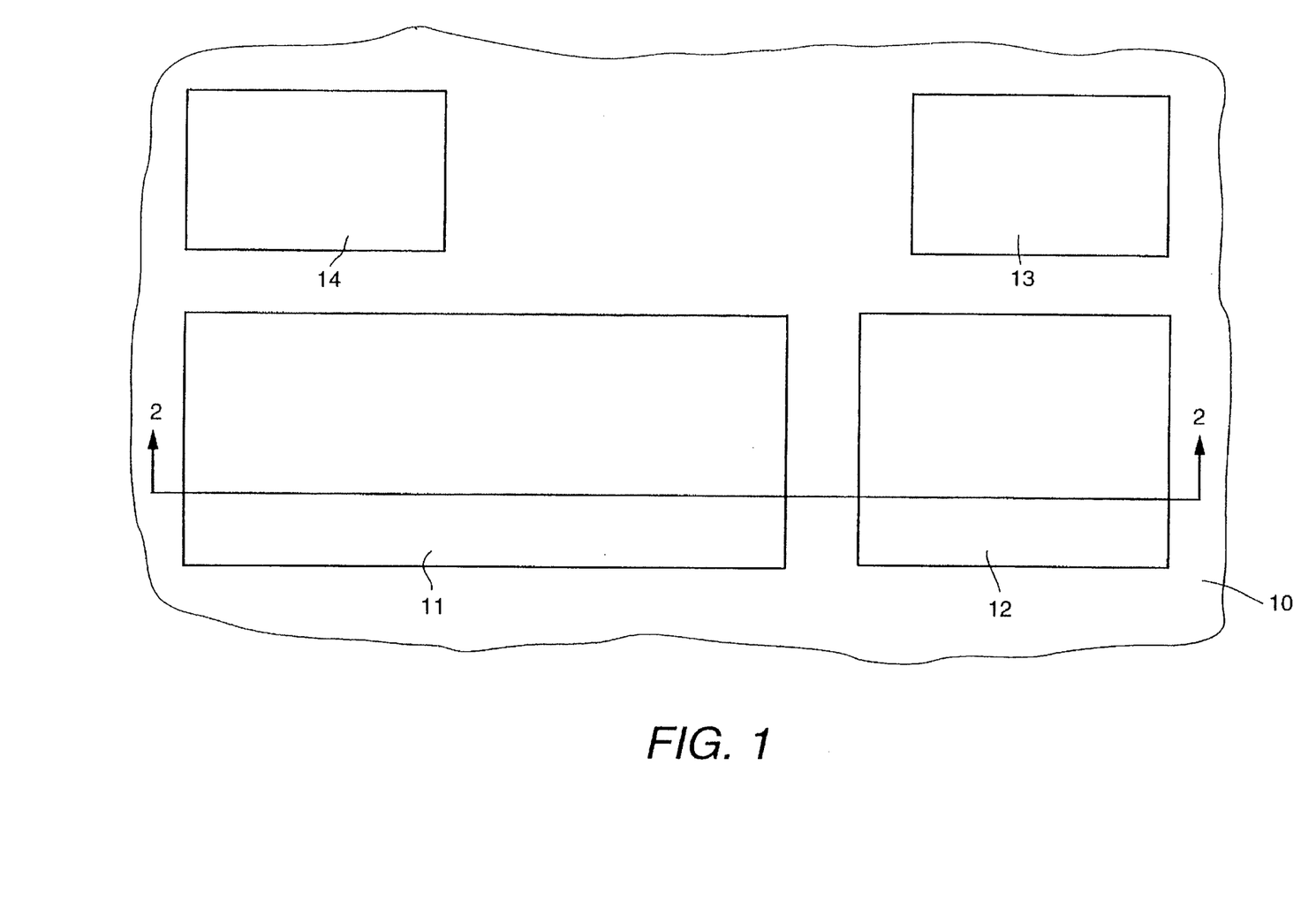
FIG. 1 is a top view of a substrate supporting a plurality of metal plates.

FIG. 1 is a top view of a substrate 10 supporting a plurality of metal plates shown as switch contact plate 11, stationary contact plate 12, and coil contact plates 13 and 14. The number and positions of the metal plates and the plate designations are for example only.

Substrate 10 may comprise any appropriate structural material and preferably comprises either silicon or a ceramic such as alumina having a thickness of about 50 mils, for example. To form the metal plates, an adhesion promoting metal layer 15a (shown in FIG. 2) such as titanium-tungsten (TiW comprising 10% titanium and 90% tungsten) can be sputter-deposited to a thickness of about 1000 Å, for example. Gold 15b (shown in FIG. 2) having a thickness of about 4 μm, for example, can then be sputter-deposited over layer 15a. The metal sheet can next be patterned into metal plates by standard etching techniques. For example, a photoresist mask (not shown) can be applied to the metal sheet, followed by a potassium iodide solution etch of a portion of the gold layer, a hydrogen peroxide solution etch of a portion of the titanium-tungsten layer, and the removal of the photoresist.

Figure 2:
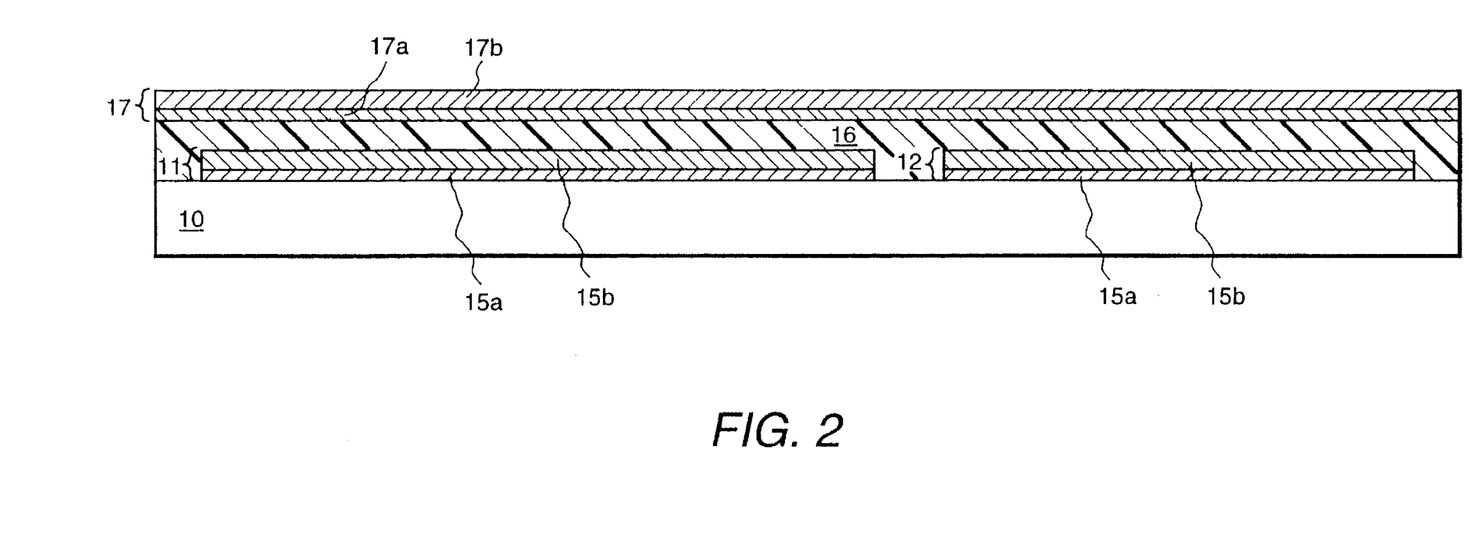
FIG. 2 is a sectional side view of FIG. 1 taken along line 2—2, further showing an insulating layer and mask layer over the substrate and, metal plates.

FIG. 2 is a sectional side view of FIG. 1 taken along line 2—2, further showing an insulating layer 16 and a mask layer 17 over the substrate and metal plates. The insulating layer is a dielectric material and preferably comprises a polyimide such as Kapton polyimide (Kapton is a trademark of E. I. dupont de Nemours & Co.) having a thickness of approximately 2 mil, for example, and coated with an adhesive (not shown) such as Ultem® polyetherimide (Ultem is a trademark of General Electric Co.).

In one embodiment for fabricating mask 17, a thin seed layer 17a of titanium (about 1000 Å) is sputtered over the insulating layer, and a thicker layer 17b of copper (about 3000 Å) is formed by sputtering a thin layer of copper over the thin layer of titanium and electroplating a 4 μm layer of copper over the thin layer of copper.

Figure 3A:
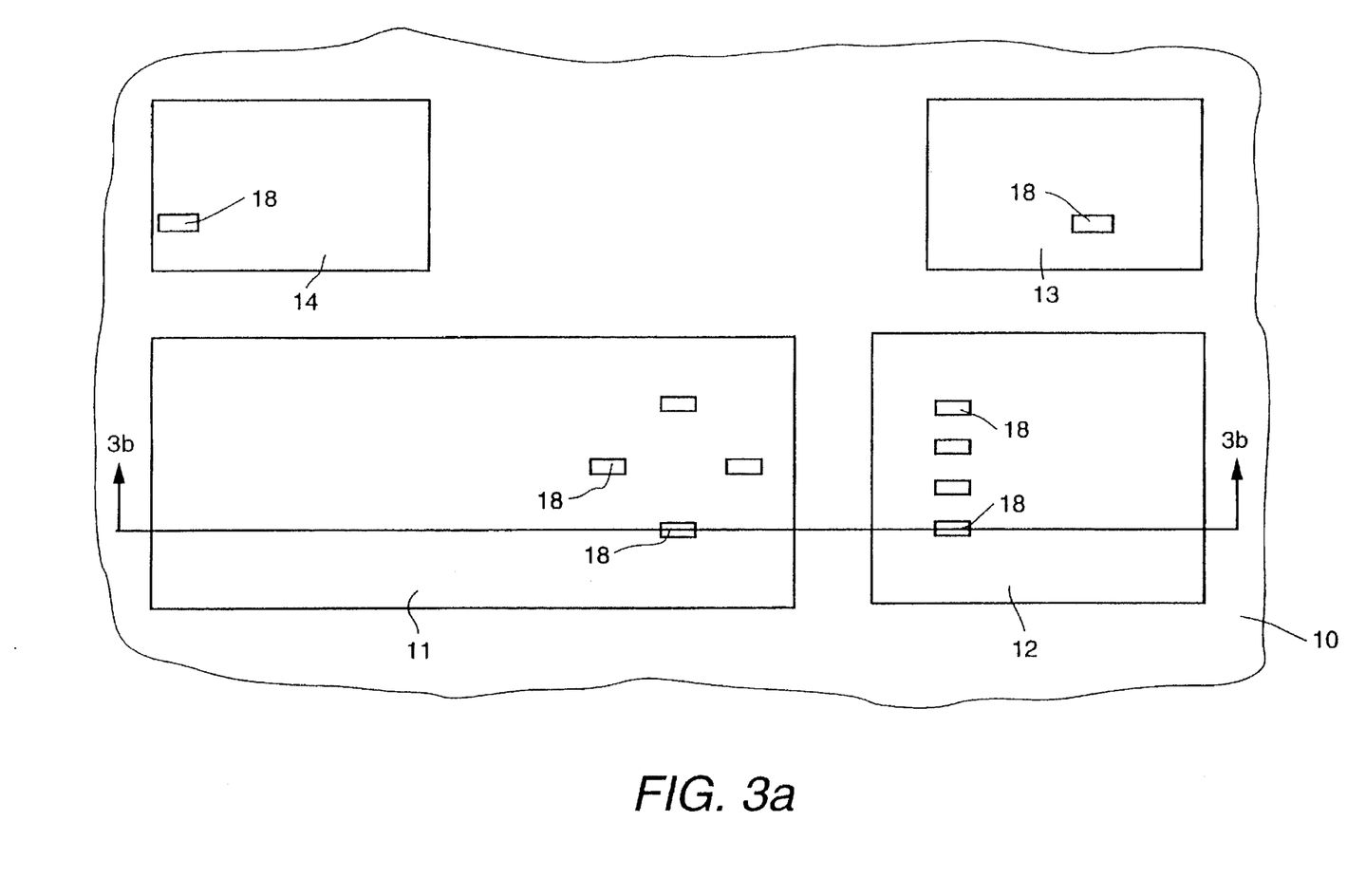
FIGS. 3a–3b are views similar to those of FIGS. 1 and 2, respectively, further showing vias in the mask and insulating layer.
Figure 3B:
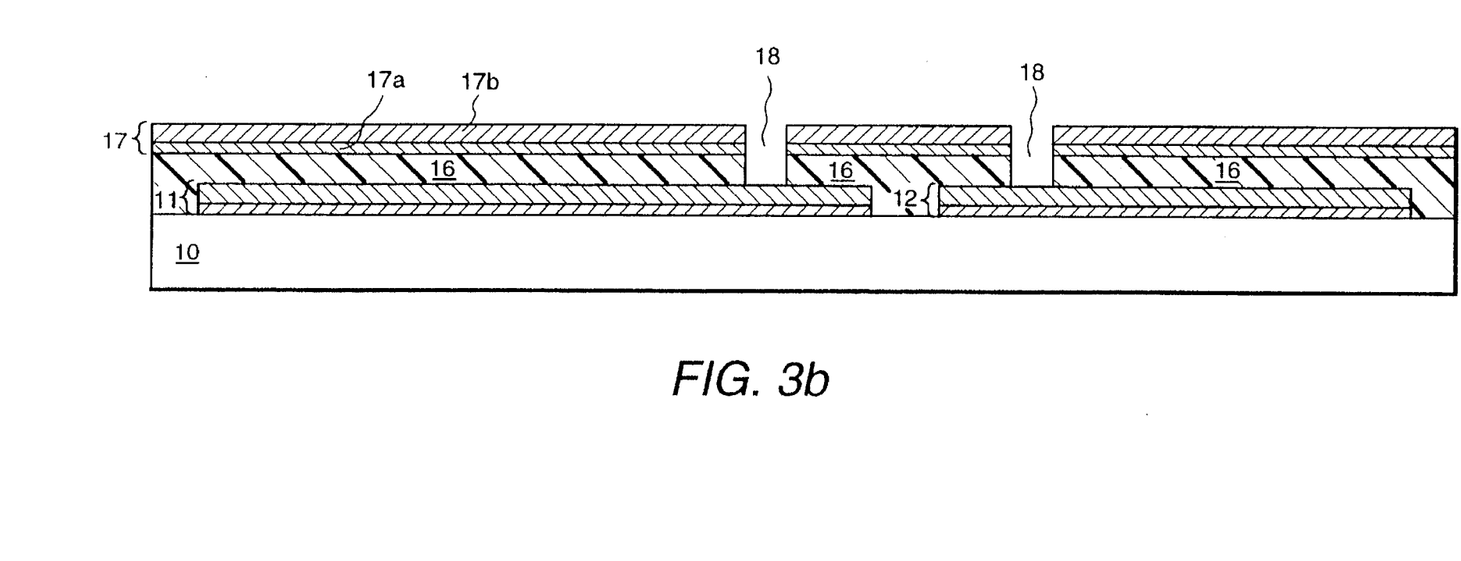

FIGS. 3a–3b are views similar to those of FIGS. 1 and 2, respectively, further showing vias 18 in the metal mask and insulating layer (for simplicity, although locations of vias 18 are shown, mask 17 and insulating layer 16 are not shown in FIG. 3a). The vias can be formed in any conventional manner. Using a photoresist mask (not shown), openings having dimensions of 3 mils by 5 mils can be etched (using a ferric chloride solution for the copper and a hydrofluoric acid solution for the titanium) into the metal mask. Then an excimer laser can ablate the insulating layer through the mask to form vias 18. Mask 17, which in this embodiment remains on the insulating layer during further processing and, for the reasons discussed below, is used in a preferred embodiment, is not a necessary feature of the present invention. Other methods of forming vias in insulating layer 16 can be used, if desired.

At least one via is preferably formed on each plate. In the embodiment of FIG. 3a, the respective vias on coil contact plates 13 and 14 are used for coupling a coil to the coil contact plates, the vias on stationary contact plate 12 are used for stationary contacts, and the vias on switch contact plate 11 are used for movable contacts, as discussed below.

Figure 4:
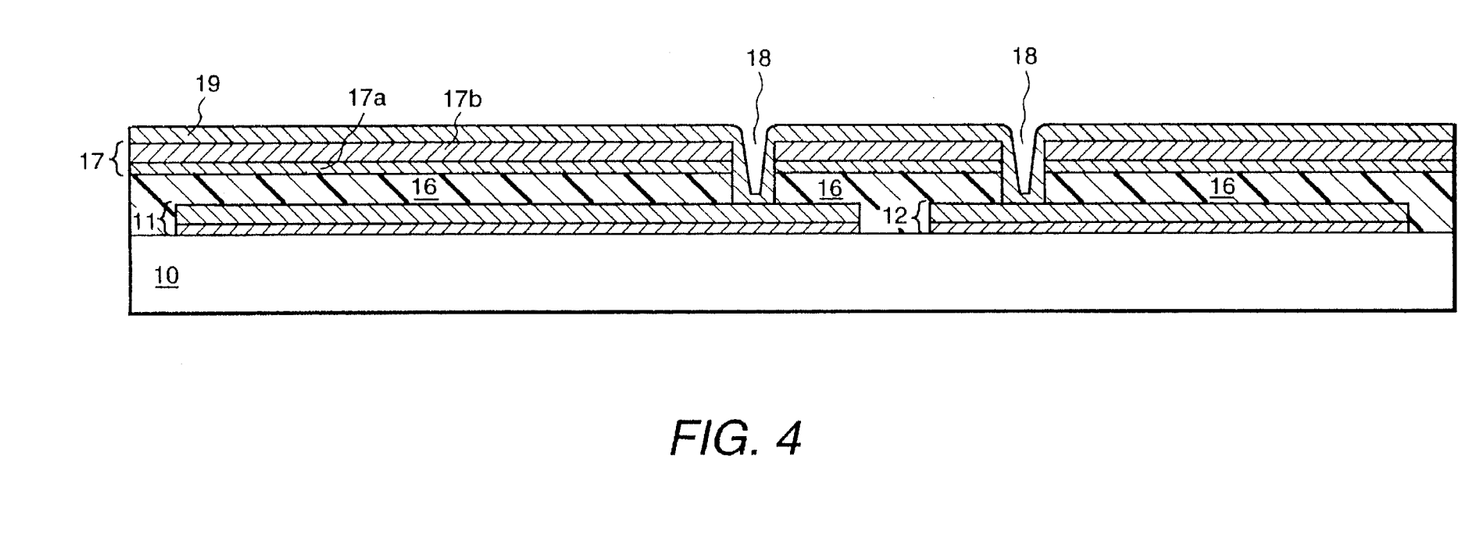
FIG. 4 is a view similar to that of FIG. 3b, further showing a metal sheet over the mask.

FIG. 4 is a view similar to that of FIG. 3b, further showing a sacrificial metal sheet 19 applied conformally over mask 17 and vias 18. Sacrificial metal sheet 19 can include sputtered and electroplated copper having a thickness of about eight microns, for example. One advantage of using metal mask 17 over insulating layer 16 and leaving the mask in place when applying sacrificial metal sheet 19 is that a portion of mask 17 can be a bottom portion of a sacrificial layer 20 (shown in FIG. 5b). This process results in a greater thickness between the insulating layer and a bridge 22 than between metal plate 11 and a moving contact 24 of bridge 22 (bridge 22 and contact 24 shown in FIG. 9).

Figure 5A:
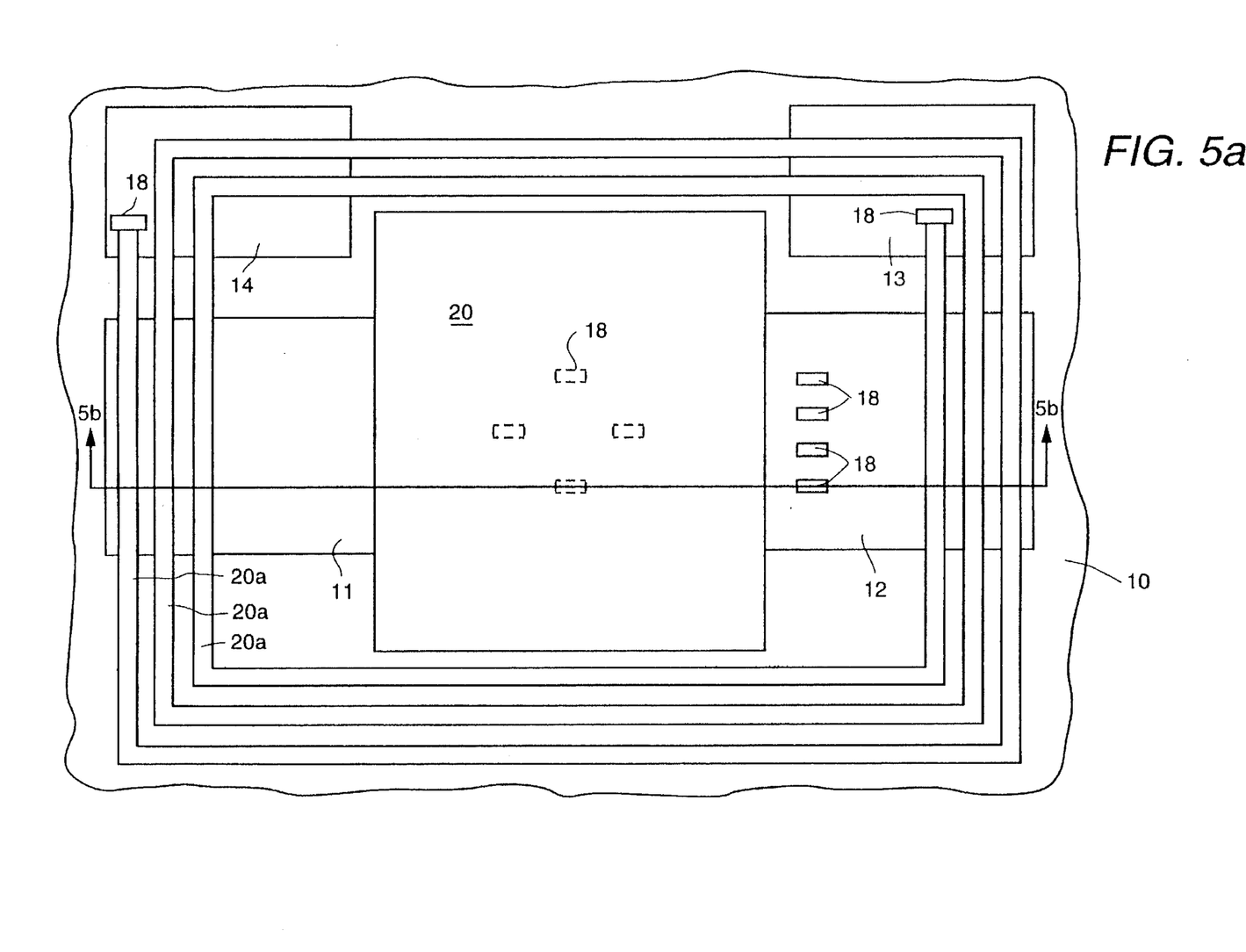
FIGS. 5a–5b are views similar to those of FIGS. 3a and 4, respectively, further showing the metal sheet after patterning has formed a sacrificial layer and a portion of a coil.
Figure 5B:
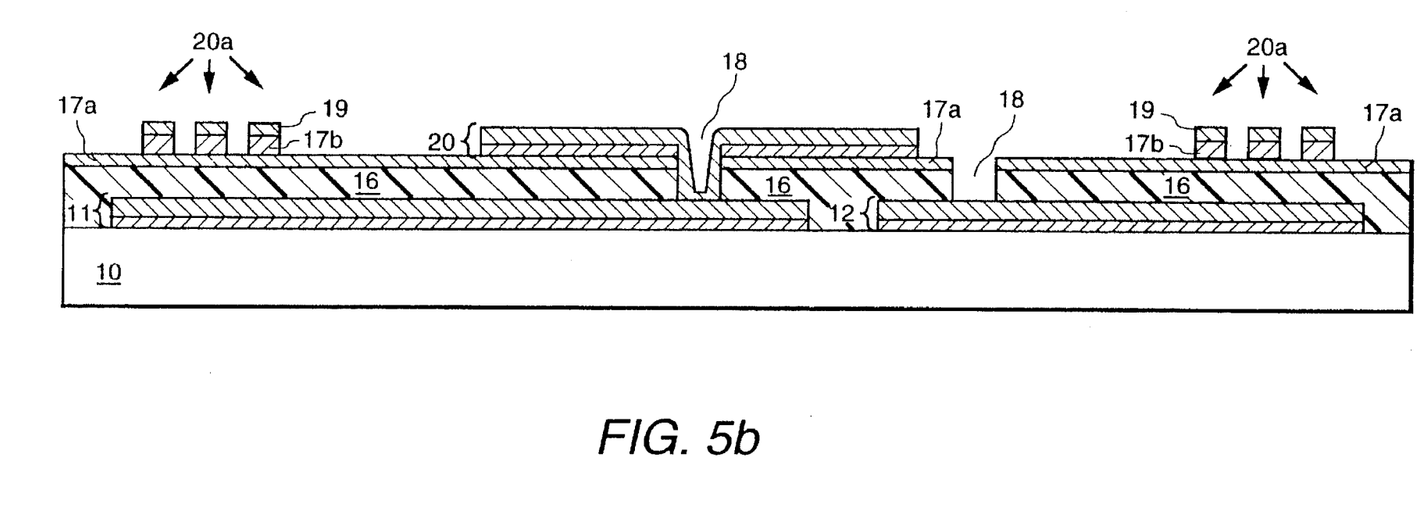

FIGS. 5a–5b are views similar to those of FIGS. 3a and 4, respectively, further showing sacrificial metal sheet 19 and metal layer 17b after patterning has formed a sacrificial layer 20 (including a sacrificial portion of metal layer 17b) and a portion of an integral coil 20a (for simplicity, thin metal layer 17a and insulating layer 16 are not shown in FIG. 5a). In alternative embodiments either no mask 17 is present so the sacrificial metal sheet is the only portion of the sacrificial layer or the entire mask can be a sacrificial portion of the sacrificial layer which is removed during switch fabrication.

Sacrificial layer and coil patterning can be performed using a standard photoresist etch process, for example. Coil 20a, which typically has many more turns (such as about 50) than are shown in FIG. 5a, is formed so that one end extends through a via 18 on coil contact plate 13 and the other end extends through a via 18 on coil contact plate 14. Sacrificial layer 20 extends over the vias on switch contact plate 11 and can extend onto stationary contact plate 12, but preferably does not extend over the vias of stationary contact plate 12.

In the embodiment shown in FIG. 5b, only the copper layers 19 and 17b are etched; the thin metal layer 17a of titanium remains on insulating layer 16 and can thus be used for adhesion of the remainder of a metal bridge, as discussed below.

Figure 6:
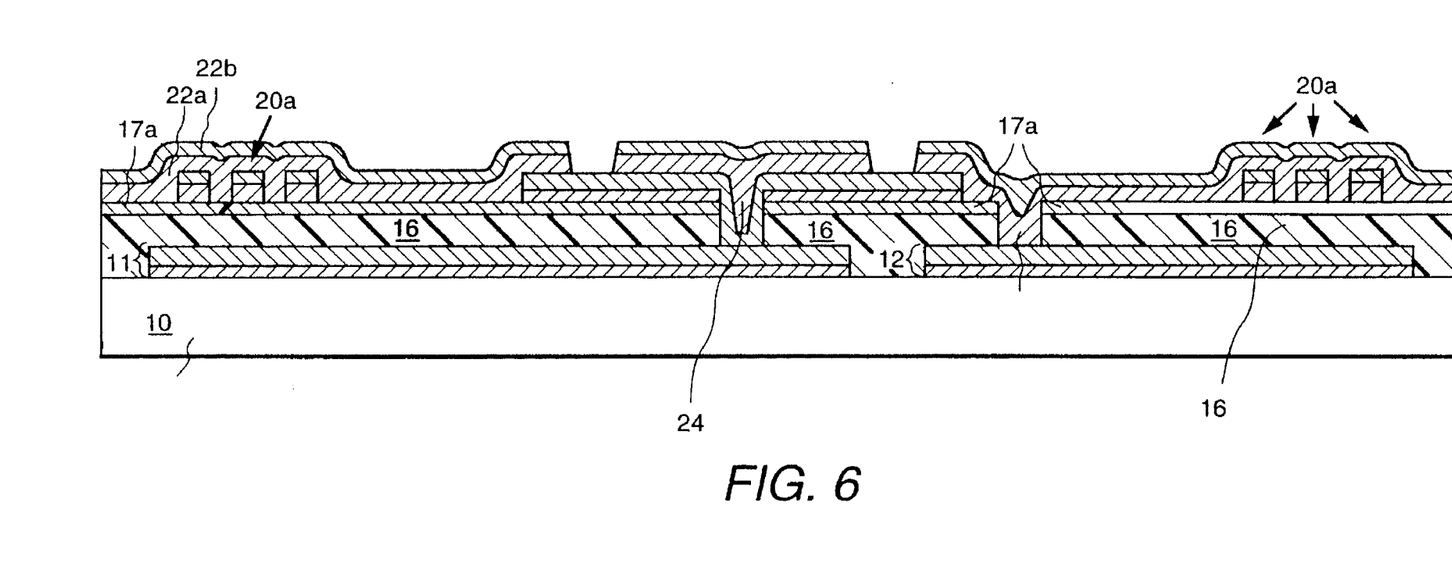
FIG. 6 is a view similar to that of FIG. 5b, further showing the application of metal bridge material over the sacrificial layer and coil.

FIG. 6 is a view similar to that of FIG. 5b, further showing the application of metal bridge material 22 over sacrificial layer 20 and coil 20a. In one embodiment, the metal bridge material includes a first layer 22a of sputtered gold having a thickness of about 1000 Å and electroplated gold having a thickness of about 10 μm and a second layer 22b of sputtered titanium having a thickness of about 1 μm. A moving contact portion 24 of the metal bridge material represents a contact of the metal bridge which will be movable after completion of the switch, and a stationary contact portion 26 of the metal bridge represents a contact of the bridge which has a fixed position in direct contact with stationary contact plate 12.

Figure 7A:
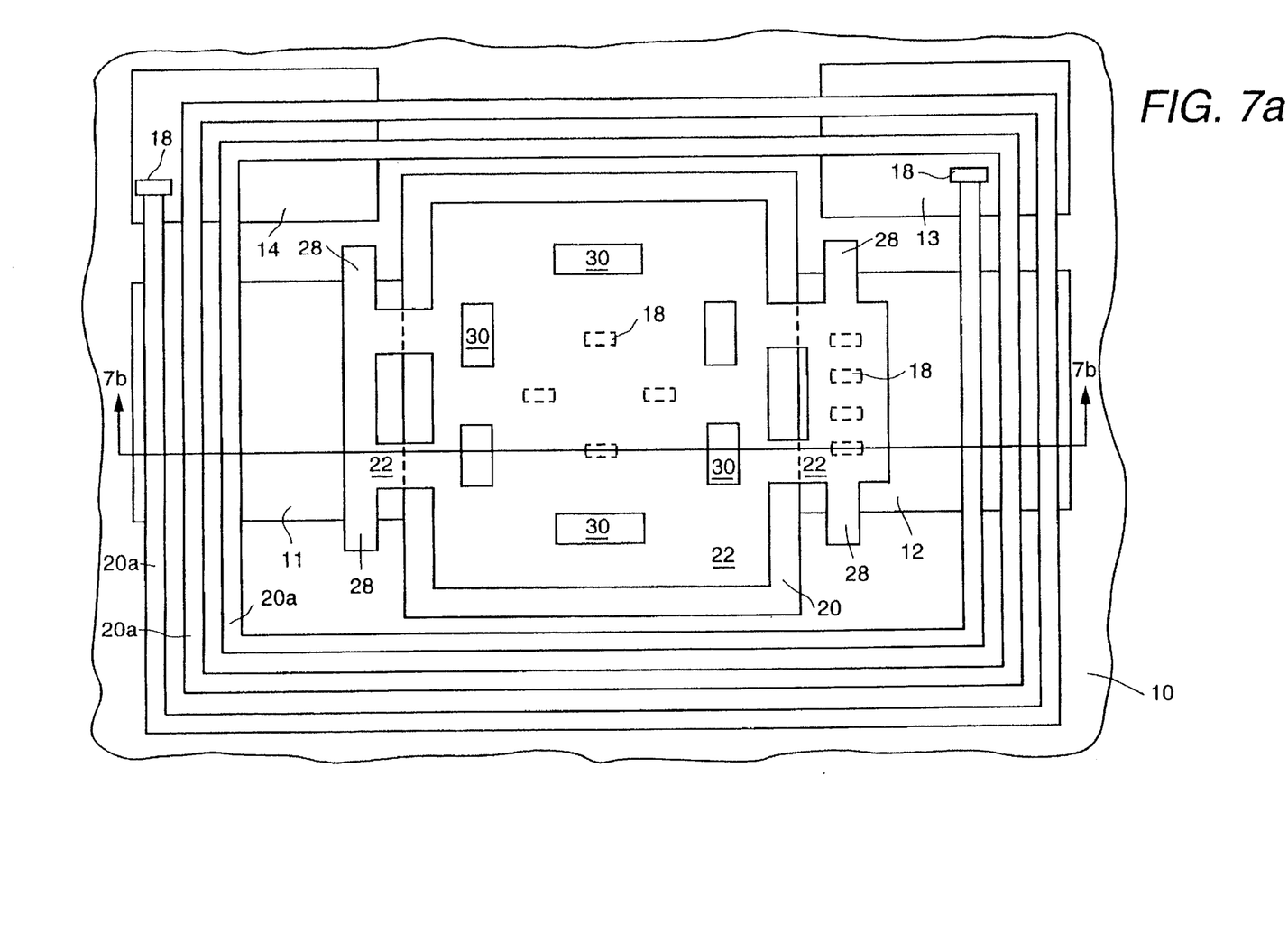
FIGS. 7a–7b are views similar to those of FIGS. 5a and 6 respectively, further showing the metal bridge remaining after the patterning of the metal bridge material.
Figure 7B:
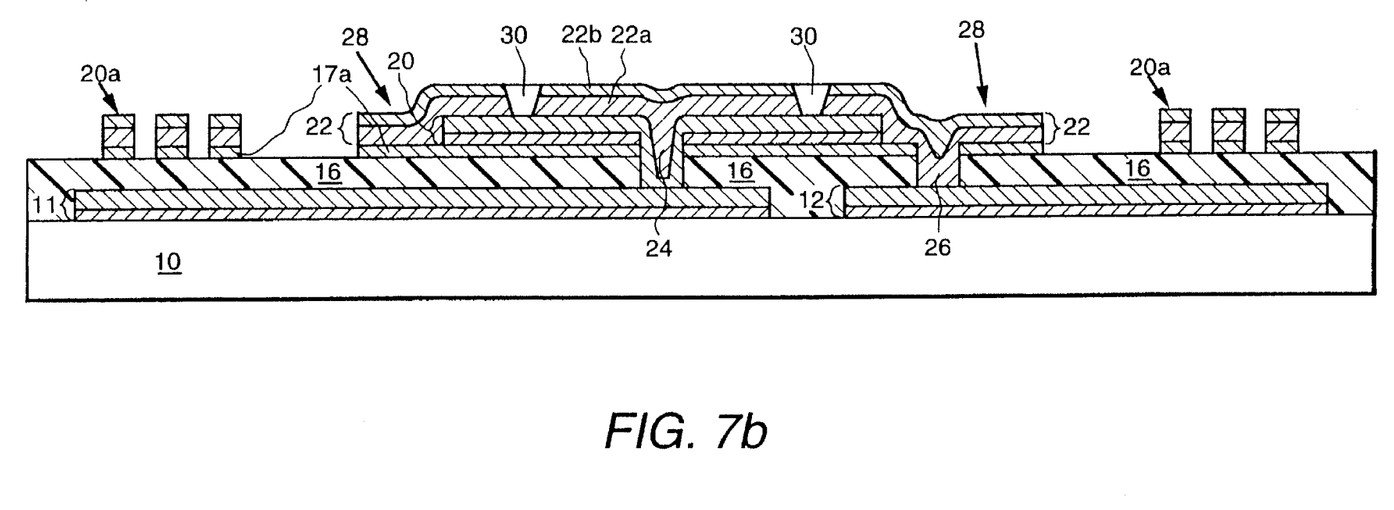

FIGS. 7a–7b are views similar to those of FIGS. 5a and 6 respectively, further showing the metal bridge 22 remaining after patterning of the metal bridge material (for simplicity, insulating layer 16 is not shown in FIG. 7a). Using a photoresist mask, the top layer of titanium 22b can be selectively etched, followed by the gold layer 22a, and the titanium layer 17a. During the patterning, openings 30 are formed in the metal bridge over selected portions of sacrificial layer 20, and coil 20a is completed. The switch can be designed in any desired manner. In the embodiment of FIG. 7a, portions of bridge 22 serve as anchors 28 for supporting the bridge.

Figure 8:
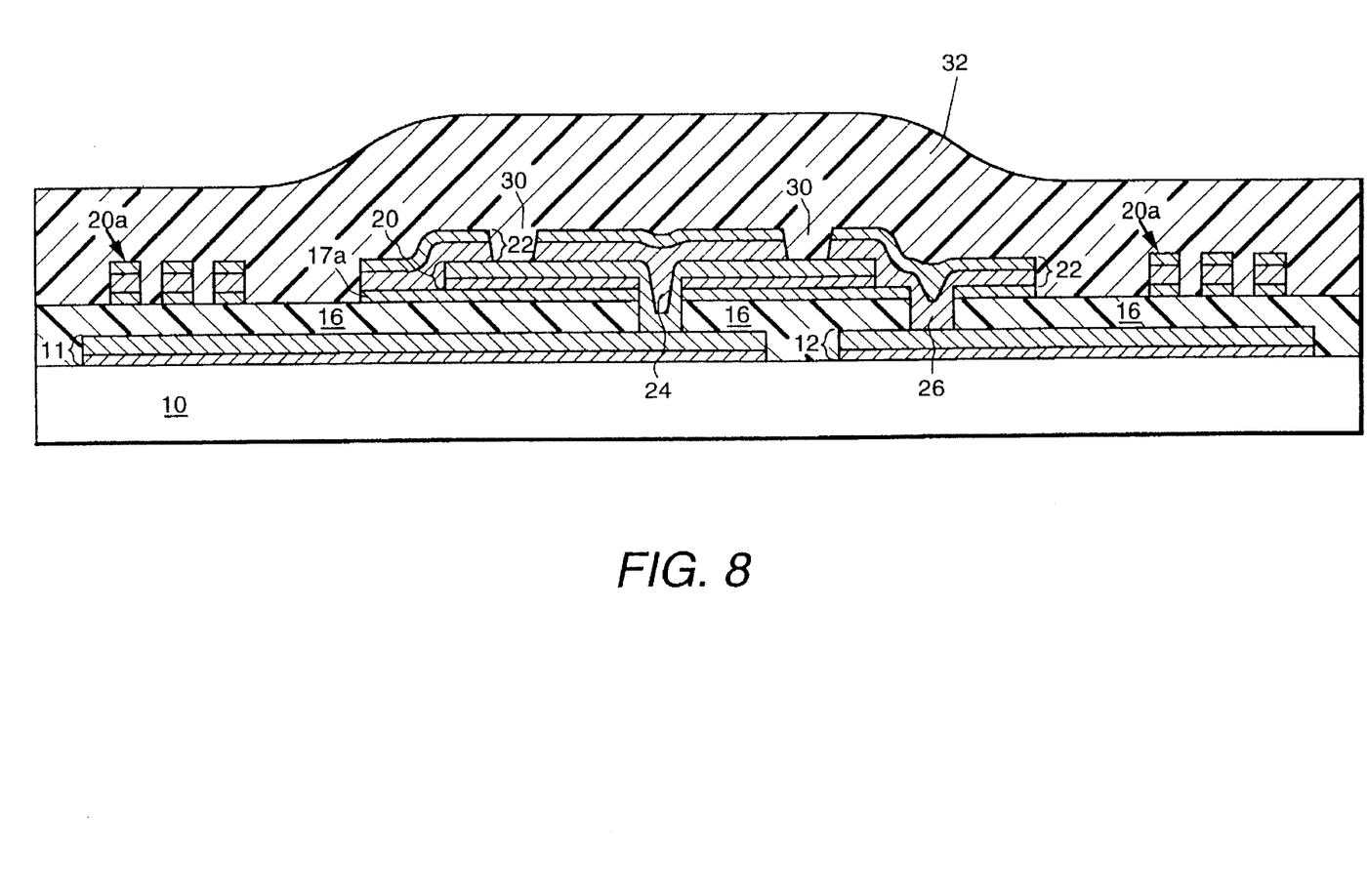
FIG. 8 is a view similar to that of FIG. 7b, further showing a reinforcing seal layer over the metal bridge.

FIG. 8 is a view similar to that of FIG. 7b, further showing a reinforcing seal layer 32 over the metal bridge. The seal layer comprises a nonconductive, flexible material such as Kapton polyimide, for example. In a preferred embodiment, the Kapton polyimide is coated with SPI(silicon polyimide)/epoxy for adhesion to the bridge. Preferably seal layer 32 also extends over coil 20a to protect the coil from becoming etched during later etch steps.

Figure 9:
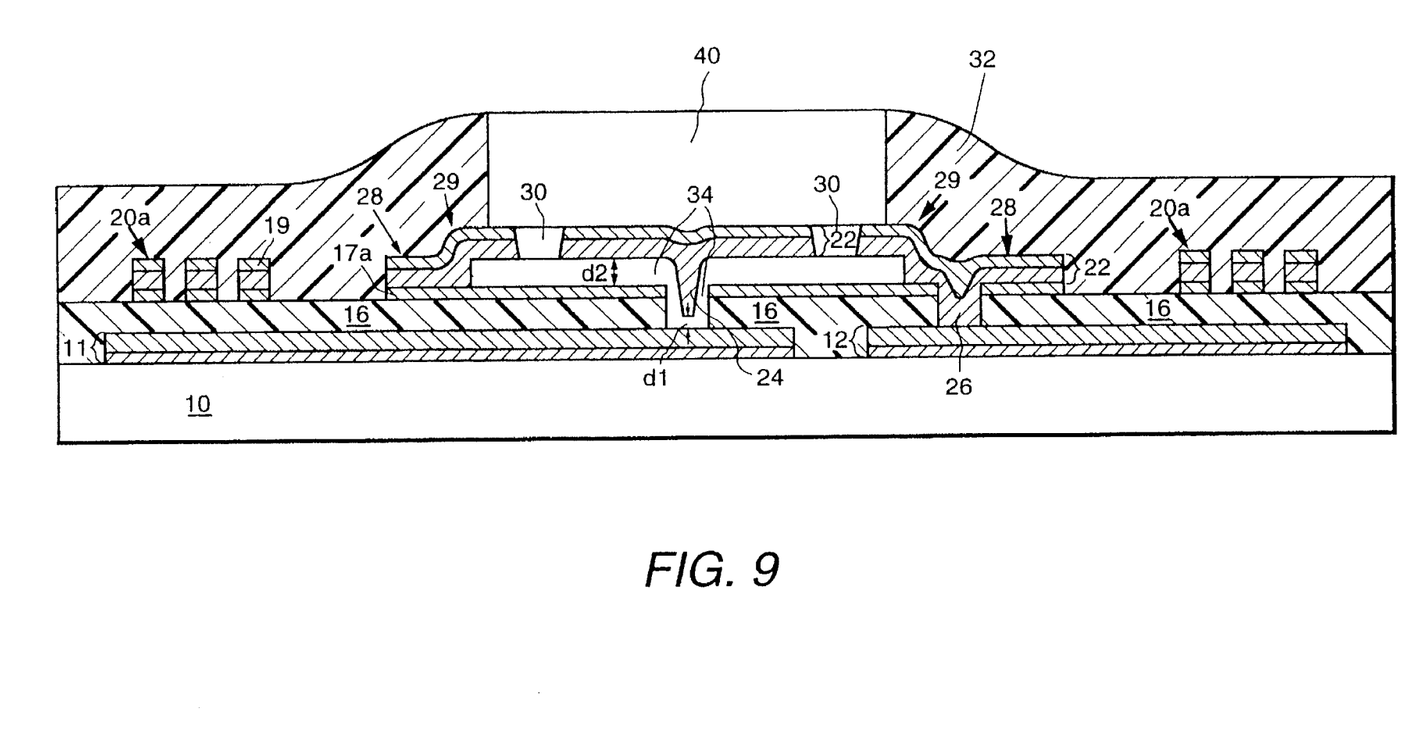
FIG. 9 is a view similar to that of FIG. 8, further showing a well in the reinforcing seal layer and an air gap below a portion of the metal bridge existing after the removal of the sacrificial layer.

FIG. 9 is a view similar to that of FIG. 8, further showing a well 40 in reinforcing seal layer 32 and an air gap 34 below a portion of the metal bridge existing after removal of the sacrificial layer. The well can be formed in seal layer 32 in a similar manner as vias 18 are formed in insulating layer 16, as discussed with respect to FIG. 3b. If a mask (not shown) is used for forming well 40, the mask is then removed.

Copper portions 19 and 17b of sacrificial layer 20 (shown in FIG. 8) are removed by a wet ferric chloride etch. This process leaves an air gap 34 which has a greater thickness $d_2$ between bridge 22 and metal layer 17a (or, in embodiments without metal layer 17a, insulating layer 16) than the thickness $d_1$ between moving contact 24 and switch contact plate 11. The switch is then rinsed, dried, and vacuum baked.

After sacrificial layer 20 is removed, bridge 22, with moving contact 24, forms flexible hinges 29 and thus provides a spring-like contact with switch contact plate 11. Seal layer 32 also serves as part of the flexible hinges.

Figure 10A:
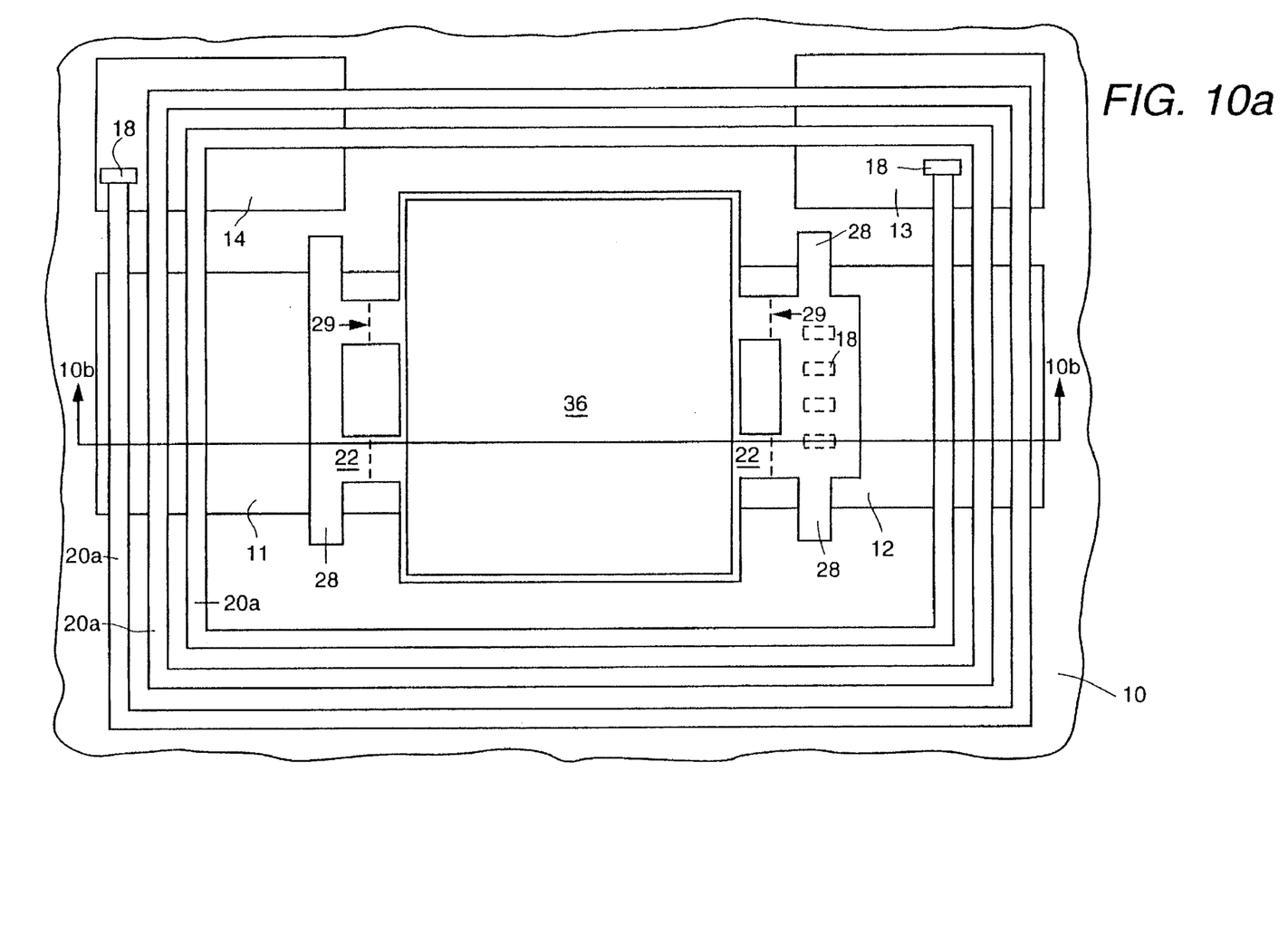
FIGS. 10a–10b are views similar to those of FIGS. 7a and 9, respectively, further showing a magnet in the well of the reinforcing seal layer.
Figure 10B:
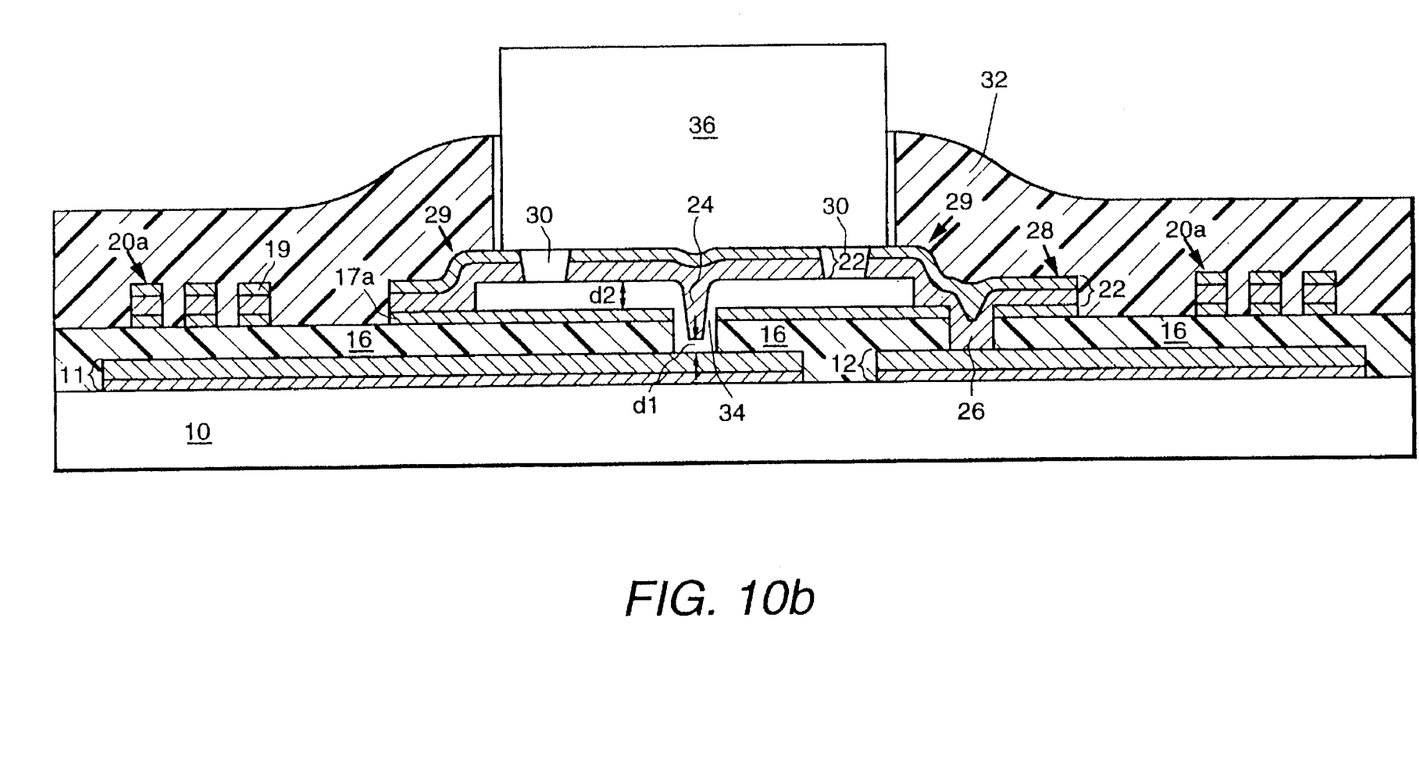

FIGS. 10a–10b are views similar to those of FIGS. 7a and 9, respectively, further showing an attached magnet 36 in well 40 of seal layer 32 (for simplicity, insulating layer 16 and seal layer 32 are not shown in FIG. 10a). Preferably magnet 36 is a rare earth permanent magnet such as NdFeB. Adhesive (not shown), such as either Ultem polyetherimide or Torlon polyamideimide (Torlon is a trademark of Amoco Performance Products Inc., of Greenville, S.C.), can be applied to the bottom of the magnet before placement, or the magnet and switch can be spray coated with adhesive after placement of the magnet.

The seal layer forms a flexible reinforcement to the metal hinges 29 of the bridge and prevents particles from interfering with the bridge during dicing of switches and when the switch is used.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A micromachined switch, comprising:

a metal plate;

an insulating layer over said metal plate, said insulating layer having at least one via extending to said metal plate;

a metal bridge situated above said at least one via and having a switch contact extending into a portion of said at least one via, said metal bridge and said insulating layer having an air gap therebetween with said metal bridge having at least one opening adjacent said air gap;

an electrically conductive coil situated on said insulating layer and surrounding at least a portion of said metal bridge; and a reinforcing seal layer over said metal bridge and said coil.

2. The switch of claim 1, wherein said reinforcing seal layer has a well situated adjacent to a portion of said metal bridge including at least a portion of said at least one opening, and further including a magnet situated in said well of said seal layer.

3. The switch of claim 1, wherein said insulating layer and said seal layer are each comprised of polyimide material.

4. The switch of claim 3, wherein at least a top portion of said metal plate and at least a bottom portion of said metal bridge comprise gold.

5. The switch of claim 1, further including an additional metal plate, wherein said insulating layer is further situated over said additional metal plate and has at least one additional via extending to said additional metal plate.

6. The switch of claim 5, wherein said metal bridge extends directly into said at least one additional via so as to make contact with said additional metal plate.

* * * * *